United States Patent [19]

Greenstein

[11] 4,032,350
[45] June 28, 1977

[54] PRINTING PASTE VEHICLE, GOLD DISPENSING PASTE AND METHOD OF USING THE PASTE IN THE MANUFACTURE OF MICROELECTRONIC CIRCUITRY COMPONENTS

[75] Inventor: Bernard Greenstein, Toledo, Ohio

[73] Assignee: Owens-Illinois, Inc., Toledo, Ohio

[22] Filed: June 12, 1975

[21] Appl. No.: 586,786

Related U.S. Application Data

[62] Division of Ser. No. 340,200, March 12, 1973, abandoned.

[52] U.S. Cl. .................................. 106/1; 106/171; 106/189; 106/193 M;171; 252/514
[51] Int. Cl.² ......................................... C09D 5/24
[58] Field of Search .......... 106/1, 189, 193 M, 171; 252/514

[56] References Cited

UNITED STATES PATENTS

| 3,684,533 | 8/1972 | Conwicke | 106/1 |
| 3,746,568 | 7/1973 | Rybarczyk | 106/1 |
| 3,759,727 | 9/1973 | Dietz et al. | 106/49 |
| 3,830,651 | 8/1974 | Minneman et al. | 106/1 |

*Primary Examiner*—Lorenzo B. Hayes
*Attorney, Agent, or Firm*—Donald Keith Wedding; Richard B. Dence

[57] ABSTRACT

A printing paste vehicle for use in dispensing solids on a substrate comprises at least one polar oxygenated solvent, a binding agent and an organic thixotrope in specified proportions. A solids dispensing paste composition comprises the vehicle, a glass binder and gold in specified proportions. A portion of the paste is deposited in the bottom of a cavity of a microelectronic package, and gradually heated to a temperature sufficient to allow the paste to flow and the gold and glass binder to settle to the bottom of the cavity. The vehicle is volatilized, and the component is subsequently fired to bond the gold to the bottom of the cavity.

24 Claims, 4 Drawing Figures

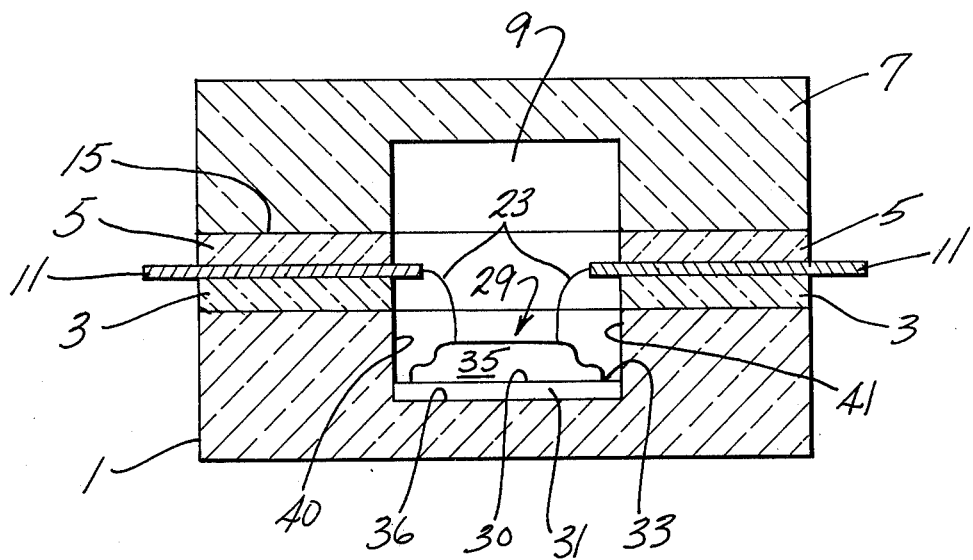

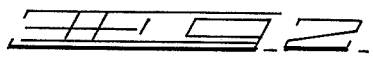
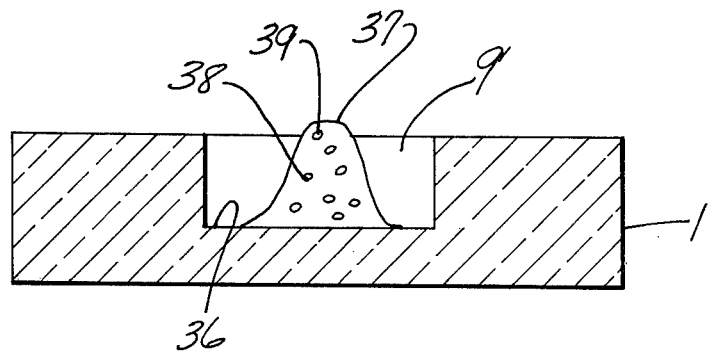
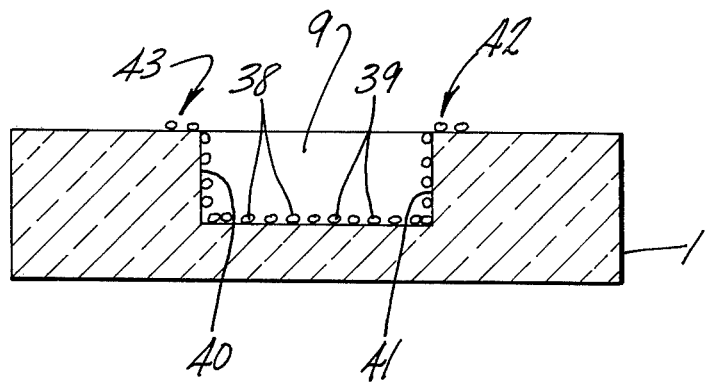
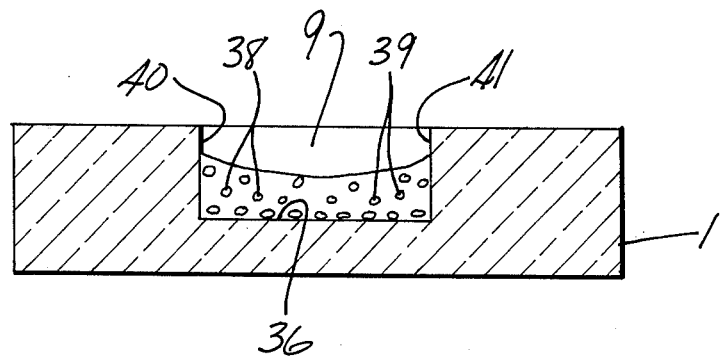

PRINTING PASTE VEHICLE, GOLD DISPENSING PASTE AND METHOD OF USING THE PASTE IN THE MANUFACTURE OF MICROELECTRONIC CIRCUITRY COMPONENTS

This is a division of application Ser. No. 340,200, filed Mar. 12, 1973, now abandoned.

This invention relates to printing paste vehicles, gold dispensing paste compositions and their use in manufacturing microelectronic packages. More specifically, this invention relates to a unique vehicle and paste composition comprising specified proportions of ingredients suitable for deposition on the bottom of a cavity in a microelectronic package.

Generally speaking, the use of silicon-gold eutectic die bonding processes is known in the microelectronic circuitry art. Typically, a microelectronic package is provided with a gold-containing lamina to which there is then bonded a silicon chip containing a microelectronic circuit.

Employing conventional techniques, the gold-containing lamina is formed at a desired location on a substrate of a microelectronic package. The location is generally a cavity defined by a floor and walls. The gold-containing lamina is provided by depositing in the cavity a portion of a composition comprising gold and a glass binder dispersed in a liquid vehicle.

Thereafter, the cavity is surrounded with components which protect the contents of the cavity from damage and deterioration and provide electrical connections between the contents of the cavity and devices outside the cavity. These components are generally bonded to the aforementioned substrate by sealing at high temperatures.

Thereafter, a delicate silicon component (e.g., silicon chip) is placed on the gold-containing lamina. The silicon component is then bonded to the microelectronic package by heating at a sufficient temperature and for a sufficient period of time to form a silicon-gold eutectic, but for an insufficient period of time and at an insufficient temperature to detrimentally affect the integrated circuit or other electronic means located in the silicon component.

In order to obtain an electronic device having reproducible electrical characteristics, and in order to avoid wasting gold in the bonding composition, it is important for the gold to cover only the floor of the cavity in the electronic package. This is not always possible when using conventional techniques, since the gold has a tendency to travel up the walls of the cavity. This results in the walls of the cavity being coated with gold which is both wasteful and undesirable because of the possible adverse effects on electrical properties. In some cases, the gold even spills over the top of the cavity apparently because of capillary action, surface tension characteristics and the increased activity of gold particles during firing cycles.

Thus, there exists a need in the art for a printing paste vehicle, a gold dispensing paste and method of use in preparing microelectronic packages. The compositions should be suitable for deposition in the cavity of a microelectronic package, without ultimately being permanently bonded to undesirable areas. The compositions and method should yield a finished product in which all of the gold is uniformly deposited and bonded to the bottom of a cavity in the microelectronic package. The sidewalls of the cavity and exterior portions of the cavity should be free of gold after firing of the components of the microelectronic package.

Accordingly, this invention provides an improved printing paste vehicle for depositing solid particles in a layer of uniform thickness on the bottom of a cavity. The improved vehicle of this invention comprises in weight percent: (1) about 83–94% of at least one polar, oxygenated, organic solvent, (2) about 2–6% of an organic binding agent, and (3) about 4–12% of an organic thixotrope.

This invention also provides an improved gold-dispensing paste composition comprising (A) about 75–25% by weight of the vehicle of this invention, and (B) about 25–75% by weight of a solids component. The solids component comprises in weight percent: (4) about 2–6% of a glass binder, and (5) about 98–94% gold powder. The paste has a fineness of less than about 20 microns.

Further, this invention provides a process of preparing the gold-dispensing paste of this invention. The process comprises preparing a solution of the organic solvent and binding agent. The organic thixotrope is added to this solution while heating and agitating the solution. There results the printing paste vehicle of this invention in a flowable form. The solids component is then added to the fluid vehicle while mixing in order to wet the solid particles. The resulting mixture is cooled to form a first paste. This first paste is subsequently milled to form a second paste having a fineness less than about 20 microns. The paste is then screened to remove contaminants. There results the gold-dispensing paste of this invention.

Additionally, this invention provides an improved process of providing a lamina comprised mainly of gold and a glass binder in a cavity of a microelectronic package. The cavity is defined by a ceramic bottom and perpendicular sidewalls. The improved process of this invention comprises depositing on the bottom of the cavity a portion of the gold dispensing paste of this invention. The cavity and its contents are then heated gradually up to about 40°–60° C. for a period of time to allow the paste to flow and substantially cover the bottom of the cavity, and to allow the solids component to settle to the bottom of the cavity. The vehicle is then volatilized at a higher temperature, for example, at a temperature above 60° C. and up to about 300° C. Finally, the solids component is fired in a conventional manner to form a strong adherent bond to the bottom of the cavity. This temperature is above 300° C.

Thus, this invention provides a printing paste vehicle, a gold dispensing paste, method of preparing the paste, and method of use in preparing a microelectronic package. The composition is suitable for deposition in the cavity of a microelectronic package, without ultimately being permanently bonded to undesirabe areas.

The compositions and methods yield a finished product in which all of the gold is uniformly deposited and bonded to the bottom of a cavity in the microelectronic package. The sidewalls of the cavity and exterior porticns of the cavity are free of gold after firing of the components which make up the microelectronic package.

Other purposes, features and preferred details of this invention will become apparent from the following detailed description of the invention which includes an analysis of the drawings briefly described as follows:

FIG. 1 is a side sectional view of a hard glass sealed microelectronic package having located therewithin a lamina for silicon-gold eutectic die bonding;

FIG. 2 is a partial side sectional view of a microelectronic package having deposited in a cavity a gold dispensing paste;

FIG. 3 is a partial side sectional view of a microelectronic package having a cavity in which gold and glass particles are adhered to sidewalls of the cavity and surfaces outside the cavity; and FIG. 4 is a partial side sectional view of a microelectronic package having a cavity containing the gold dispensing paste of this invention.

This invention can be more clearly understood if one is acquainted with the general structure of a microelectronic package or device. Having developed a familiarity with the microelectronic package, the problem which confronted workers in the art can then be readily understood.

Referring to FIG. 1, there is illustrated a typical microelectronic package well known in the art. Such a package is comprised of a ceramic substrate 1 having a cavity 9, a sealing glass layer 3, electrical leads 11, another sealing glass layer 5, and a ceramic lid 7. The ceramics are typically alumina. The cavity is defined by a bottom 36 and sidewalls 40 and 41 perpendicular to the bottom 36.

The term "sealing glass" is well understood in the microelectronic package art. The expression is used herein in accordance with its conventional meaning. That is to say, the term sealing glass is to be understood to mean a glass typically used in the microelectronic package art which is electronically insulating in nature, and which has a fiber softening point less than about 500° C.

Electrical leads 11 terminate in the cavity 9. Leads 11 are connected by microconnections or other leads 23 with a microelectronic component generally represented as 29.

Leads 11 can be located within sealing glass layers 3 and 5 by any conventional technique. As illustrated, leads 11 are within layers 3 and 5.

Generally speaking, the microelectronic component 29 is required to be hermetically sealed within cavity 9. Therefore, lid 7 is generally hermetically sealed to the layer 5 by firing at an elevated temperature.

Microelectronic component 29 comprises a base lamina 31 which has a layer of gold on its surface 30. Typically, the gold layer is formed from a composition comprising gold and a glass binder. The composition is fired at a temperature and for a period of time in order for a major portion of the gold to migrate to surface 30, while a major portion of the glass binder migrates to the bottom 36 of the cavity 9. Base lamina 31 is bonded eutectically to a silicon chip 35 containing a delicate integrated electronic circuit (not shown for convenience). Fillet 33 indicates the presence of a eutectic bond.

Referring next to FIG. 2, the base lamina (31 in FIG. 1) is provided in cavity 9 by depositing a portion of a gold dispensing paste 37 on the floor 36 of cavity 9. The gold dispensing paste 37 has dispersed therein gold particles 38 and glass binder particles 39.

Referring to FIG. 3, the arrangement shown in FIG. 2 is fired by heating it at an elevated temperature. The particles 38 and 39 are left on the surfaces of cavity 9. As shown in FIG. 3, a portion of the particles adhere to the walls 40 and 41 of the cavity, and a portion of the gold particles may even flow out of the cavity apparently due to the forces of capillary action, surface tension characteristics, and increased activity of gold particles at elevated temperatures, resulting in particles as shown at 42 and 43. As previously noted, deposition of gold particles on the walls of the cavity and surfaces outside the cavity is undesirable.

By practicing this invention, these undesirable results can be obviated. This is accomplished by depositing a portion of the composition of this invention in cavity 9 in a manner similar to that shown in FIG. 2. The cavity containing the deposited composition is then gradually heated so that the gold dispensing paste 37 flows to fill the cavity as depicted in FIG. 4. When the gold dispensing paste of this invention is gradually heated to a temperature of about 40°-60° C., all gold particles 38 and all glass binder particles 39 settle to the bottom 36 of cavity 9 to form a layer of uniform thickness. The particles settle because of a sudden reduction in viscosity of the gold dispensing paste at about 40°-60° C.

After the particles have settled to the bottom of the cavity, the gold and glass binder particles are then fired at a higher temperature to bond the gold and glass to substrate 1 within cavity 9. There then results, full cavity coverage with gold.

Because of the ingredients in the compositions of this invention and their relative proportions, the gold and glass particles can be maintained in a uniform distribution throughout the gold dispensing paste while the paste is at about room temperature. Elevating the temperature of the gold dispensing paste of this invention, permits the gold and glass particles to settle out. The gold dispensing paste can then be heated to evaporate volatile components and fugitive materials, leaving only a uniform layer of gold and glass. The subject invention permits the preparation of a finished product in which all of the gold is uniformly deposited and bonded to the bottom of the cavity of a microelectronic package. None of the gold is bonded to the sidewalls of the cavity, nor on surfaces outside the cavity.

The printing paste vehicle of this invention comprises a uniform mixture of at least one polar oxygenated solvent, a binding agent and an organic thixotrope in specified proportions.

The gold dispensing paste of this invention comprises the vehicle of this invention, a glass binder and gold. The glass binder and gold are termed the solids component.

More particularly, the printing paste vehicle of this invention comprises in weight percent about: 2-5% of the binding agent, 83-94% of the organic solvent, and 4-12% of the thixotrope. Preferably, the vehicle comprises in weight percent about: 2-3% of the binding agent, 88-92% of the organic solvent and 6-9% of the thixotrope.

The solids component of the paste of this invention comprises in weight percent about: 2-6% of the glass binder and 98-94% gold powder. Preferably, the solids component comprises in weight percent about: 3-5% glass binder and 97-95% gold powder.

The proportions of the vehicle and solids component in the paste is about 25 weight percent – 75 weight percent solids to about 75 weight percent – 25 weight percent vehicle. The preferred proportion of the solids component is about 58 percent by weight – 70 percent by weight. It is particularly preferred that the solids component comprises about 64% by weight of the paste. The preferred proportion of vehicle in the paste is about 42 weight percent – 30 weight percent. An amount of about 36% by weight of the vehicle in the paste is particularly preferred. It has been found that solids content above about 75% by weight is to be avoided because the flow properties of the paste are retarded due to low amount of vehicle.

The paste of this invention can be deposited in the cavity by employing known techniques. Typically, a charge of about 2–3 mgs. of a paste comprising about 50% vehicle and about 50% solids component would result in a gold lamina (i.e. after firing) having a thickness of about 100 microinches in a cavity 110 mils by 140 mils by 5 mils. A similar charge of a paste comprising about 25 weight percent vehicle and about 75% by weight solids component would result in a gold film lamina of about 400 microinches (after firing). The particularly preferred paste comprising about 36% by weight vehicle and about 64% by weight solids results in a film thickness of about 200–300 microinches after firing.

The proportions of vehicle and solids component in the paste, and the amount of paste deposited in the cavity vary with the dimensions of the cavity. The cavity is typically charged with an amount of paste which will fill the cavity to about ¾ of its depth after the paste has flowed. Thus, for a given lamina thickness, pastes having a lower proportion of solids will be used in a cavity of greater depth than one of lesser depth. If the cavity is filled to less than about ½ its depth, there can result an undesirable build-up of solids in the corners of the cavity since the depth of the paste is greater near the sidewalls due to wetting of the walls. If the cavity is filled to too great a depth, the paste will spill out on heating. The optimum depth can be determined with a minimum of experimentation.

The organic solvent employed in the compositions of this invention can be any polar, oxygenated, organic solvent which can be practically totally evaporated from the gold dispensing paste during a drying period of about 5–20 minutes at about 80°–300° C. These organic solvents typically have boiling points of about 150°–400° C. The solvents can also be characterized as having vapor pressures of about 10 mm Hg at about 200°–400° C.

The organic solvent is selected so that it is capable of dissolving both the binding agent and the thixotrope. It must also be selected so that there is practically no boiling of the vehicle when the microelectronic package is subjected to the preheat step (i.e. the heating before firing).

Typical of the polar, organic, oxygenated solvents are the alcohols, ketones, and esters. Pine oils, terpineols and the like can be used.

Other examples of volatile organic liquid solvents which can be used in this invention are various substituted and unsubstituted polyols.

Specific examples include ethylene glycol, diethylene glycol, triethylene glycol, tetraethylene glycol, polyethylene glycol, propylene glycol, dipropylene glycol, tripropylene glycol (e.g. P-200), polypropylene glycol having an average molecular weight of about 400–550, glycerin and its derivatives, hexylene glycol, 1,5-pentanediol, 2-methyl-2-ethyl-1, 3-propanediol, 2-ethyl-1,3-hexanediol, 1,2,6-hexanetriol, thiodiglycol and 1,3-butylene glycol. Particularly preferred is a polypropylene glycol having an average molecular weight of about 400.

Other organic solvents employed in this invention include any of the well known liquids used in printing pastes to control viscosity and rate of drying. Typical of these organic solvents are diethylene glycol monobutyl ether acetate, diethyl phthalate, iso-amyl salicylate, higher boiling paraffins, cyclo-paraffins, aromatic hydrocarbons and the mono-and di-alkyl ethers of diethylene glycol or their derivatives (e.g., diethylene glycol hexyl ether). A particularly preferred solvent for use in this invention is diethylene glycol monobutyl ether acetate.

Still other solvents are methyl "Cellosolve" acetate ($CH_3COOCH_2CH_2OCH_3$), Cellosolve acetate ($CH_3COOCH_2CH_2OC_2H_5$), butyl Cellosolve acetate ($CH_3COOCH_2CH_2OC_4H_9$), 2-ethylhexyl acetate, diethylene glycol monoethyl ether acetate ($CH_3COOCH_2CH_2OCH_2CH_2OC_2H_5$) and glycol diacetate ($CH_3COOCH_2CH_2OOCCH_3$).

Typical of the aliphatic alcohols are the higher boiling alcohols, such as iso-decyl alcohol, n-decyl alcohol, 3-methoxy butyl alcohol, iso-octyl alcohol, tridecyl alcohol, and the like.

Still other solvents include acetophenone, cyclohexanone, diisobutyl ketone, isophorone, methyl heptyl ketone, and the like.

Typical aromatic alcohols include benzyl alcohol, 3-methyl benzyl alcohol, α-methyl-p-tolyl carbinol, 1-phenyl-n-propyl alcohol, 2-phenylethanol, α-isopropylebenzyl alcohol, 2-pehnoxyethanol, and the like.

As will be apparent from the discussion hereinafter, mixtures of solvents can be used. A preferred solvent system comprises diethylene glycol monobutyl ether acetate and a polypropylene glycol having an average molecular weight of about 400.

The binding agent employed in the compositions of this invention adds "green-strength" to the gold dispensing pastes. Its primary purpose is to give the paste a viscosity shear ratio of less than 10 at 1 and 10 RPM as measured on a Brookfield RVT Viscometer. Any of the well known organic binding agents useful in printing pastes can be employed in practicing this invention. Typically, these organic binding agents include ethyl cellulose, cellulose acetate butyrate, hydroxy methyl cellulose, polyisobutylene, polyvinyl alcohol, polyvinyl acetate, polyacrylates and polymethacrylates typically of the $C_1$-$C_4$ aliphatic alcohols, polyvinyl butyral, natural gums, synthetic resins and the like.

A preferred binding agent for use in this invention is ethyl cellulose having a chain length (i.e., viscosity indication of chain length) of N-4 to N-200, or mixtures thereof. A particularly preferred ethyl cellulose for use in practicing this invention is N-4 ethyl cellulose. This ethyl cellulose is a cellulose ether having about 47.5–49% ethoxyl content and a viscosity of about 3–5.5 centipoise when measured at 25° C. in a 5% by weight solution of 80:20 weight ratio toluene-ethanol solution.

The organic solvents and binding agents are not critical to the successful operation of this invention. Thus, it will be understood that conventional materials can be employed without detrimentally affecting the desirable results attained by practicing this invention. Rather, it is the relative proportion of binding agent and thixotrope which are important. In most instances, the amount of binder in the paste is relatively low, while the amount of thixotrope is large when compared with prior art compositions.

The thixotropes contemplated for use in this invention are organic because they must be capable of being burned out of the paste. The organic thixotropes employed in this invention must be capable of being burned out at a temperature up to about 400° C., preferably about 300° C. or less.

Preferred thixotropes are the hydrogenated castor oils (e.g. glyceryl tri-12-hydroxystearate). A particularly preferred thixotrope for use in this invention is the organic thixotrope Thixcin E, which is a solidified hydrogenated castor oil having a particle size of less than about 50 microns.

Gelling agents may be optionally added to the composition of this invention in order to enhance the ability of the thixotrope to remain in the system and form a paste. Examples of such gelling agents include N-soya trimethylene diamine, oleyl trimethylene diamine, primary cocoanut amine admixed with crotonic acid, the fatty acid amines, such as Adogen 572 made by Ashland Chemical Corporation, and the primary cocoanut amines, such as Armeen CD made by Armour Industrial Chemical Corporation.

Those skilled in the art will recognize that the exact nature of the glass binder will in part be dictated by the thermal expansion characteristics of the substrate to which the composition of this invention is to be applied. The substrate for use in this invention can be any of the well-known ceramic substrates conventional in the art. For best results, it is preferred to use ceramic substrates having a coefficient of thermal expansion of less than about $100 \times 10^{-7}$ in./in./° C. Examples of the ceramic substrates conventionally used in the microelectronic circuitry art are the aluminas, the beryllias, the hafnias, cordierite ([Mg, Fe] $Al_4Si_5O_{18}$), steatite (hydrous $MgSiO_4$), olivine $(MgFe)_2SiO_4$ and mullite ($3Al_2O_3 \cdot 2SiO_2$). The accepted coefficient of thermal expansion (0°-300° C.) for these conventional substrates are listed in the following table:

TABLE A

| Ceramic Substrate | $*\alpha(\times 10^7 in./in./° C)$ |
|---|---|
| aluminas | 65-85 |
| beryllias | about 95 |
| hafnia | about 97 |
| cordierite | about 30 |
| steatites | 77-82 |
| forsterite | about 99 |
| mullite | about 42 |

*at least from 0-300° C.

A particularly preferred substrate contemplated for use in the environment of this invention is an alumina substrate comprised of 96 percent $Al_2O_3$ which is a conventional substrate used in the microelectronic circuitry art and which has a coefficient of thermal expansion of about $79 \times 10^{-7}$ in./in./° C.

The glass-gold compositions employed in this invention are generally employed so as to form an intermediate layer between a silicon chip and a conventional ceramic substrate. Thus, the glass binder compositions employed in this invention generally have a thermal coefficient of expansion of about $255-130 \times 10^{-7}$ in./in./° C (0°-300° C). Preferably the coefficient is from about $45-80 \times 10^{-7}$ in./in./° C (0°-300° C) and in the most preferred instances, where a conventional alumina substrate is employed, the coefficient is about $60-75 \times 10^{-7}$ in./in./° C (0°-300° C).

When used in microelectronic packaging the glass binder compositions employed in this invention generally have a fiber softening point such that they will act as a glass binder with gold or gold-noble metal alloy at a temperature below the temperature at which gold globules (gold coalescence) will occur in the system. Preferably the fiber softening point is at least about 100° C. below the maximum processing temperature for the package (which, of course, is below the gold coalescence point), but is not so low that the viscosity of the glass will not allow the glass to settle, and thus the gold to migrate to its surface. These conditions are met for most instances contemplated by this invention if the fiber softening point of the glass binder composition is about 350°-750° C.

The glass binder employed in the solids conponent can be any glass binder conventional in the microelectronic circuitry art, including those used in conductive, resistive and dielectric microelectric printing pastes. Typically, lead-zinc-borate glasses, lead borosilicate glasses, and lead-barium-borosilicate glasses can be used.

A preferred glass comprises the following components expressed in about weight percent of oxide ingredients:
PbO: 57%
ZnO: 21%
$B_2O_3$: 22%

When the glass binder is a lead borosilicate glass, preferably the binder has about 48-62% by weight PbO.

Another preferred glass binder for use in this invention consists of (by weight) about 17.6% $SiO_2$, 16.0% $B_2O_3$, 0.4% $Al_2O_3$, 60.0% PbO, and 5.9% CdO.

The glass binders used in this invention can be mixed with up to about 8.0 weight percent $Bi_2O_3$ to aid adhesion to the substrate.

Another preferred class of glass binder compositions contemplated for use in this invention have the above thermal coefficient of expansion and fiber softening point characteristics and are comprised of, by weight: 5-75% $B_2O_3$, 0-20% $Al_2O_3$, 0-75% ZnO, and 0-45% $SiO_2$ wherein at least about 1-5% by weight is at least one of $Al_2O_3$, ZnO, $SiO_2$ or mixtures thereof.

As is known in the art, a noble metal other than gold can be used in combination with the glass binder and gold particles. The noble metal must generally be non-oxidizing, soluble with gold, and capable of increasing the melting point of the gold when admixed therewith. It is generally added in amounts ranging from about 0-8% by weight to increase the melting point of the gold so that coalescence of the alloy formed upon firing will not occur when the sealing of the electrical component occurs. The preferred noble metal is palladium, and is used in an amount of up to 6% by weight.

Persons skilled in the art will also recognize that the particle size of the constituents of the glass binder are generally controlled to permit a uniform coating having good cosmetic properties to be formed. Typically, the particle size is less than about 10 microns. Preferably, the average particle size is less than about 5 microns. An average particle size of about 1-2 microns is particularly preferred.

The gold employed in practicing this invention is a gold powder of the type conventionally used in microelectronic circuitry for forming silicon-gold eutectic bonds in microelectronic devices. Typical and preferred particle sizes for the gold are the same as those for the glass binder. A particularly preferred gold powder is A-1570 sold by Englehard Minerals and Chemical Company. Another preferred Englehard gold is A-1984.

It will be recognized that the solids component is not limited to glass and gold particles. Rather, these particulate materials have merely been mentioned in describing a preferred embodiment of this invention, namely, a gold dispensing paste for full cavity gold coverage.

Any particulate material which is to be deposited in a cavity defined by a bottom and sidewalls can be used in this invention when it is desired that the particulate material not adhere to the sidewalls or creep over the walls. Therefore, the solids component can be copper, substantially pure gold (e.g. 99% or more gold), a noble metal other than gold, for example, silver, palladium, platinum, and the like or mixtures or alloys of noble metals, or glass binders alone. Again, metals and glass binders are merely mentioned by way of example. The concept of this invention is applicable to the deposition of solid particles in cavities in general. The main requirement is that the solid particles have a specific gravity greater than the specific gravity of the vehicle at about 40°–60° C. in order that the particles do not float in the vehicle when the vehicle reaches the temperature at which its viscosity is suddenly reduced (i.e. 40°–60° C.). The solid particles should preferably have a particle size of the range previously mentioned for glass particles.

A preferred process of preparing the gold dispensing paste of this invention comprises dividing the organic solvent into two portions. A solution of the binding agent in a first portion of the organic solvent is then prepared. To this solution there is then added the second portion of the organic solvent while heating and agitating to form a homogeneous first mixture. The thixotrope is then added to the first mixture while heating and mildly agitating the first mixture. The first mixture and thixotrope are further heated and agitated to form the vehicle, which is in a flowable form. The solids component is then added to the fluid vehicle while mixing in order to wet the solid particles. The resulting mixture is cooled to form a first paste. This first paste is subsequently milled to form a second paste having a fineness less than about 20 microns. The paste is then screened to remove contaminants, and there results the paste of this invention.

When the paste of this invention is a gold dispensing paste, it is preferred that glass binder and gold particles be added separately to the vehicle, with the glass being added first. The gold can then be added. The solids component is added while heating and agitating the vehicle.

A typical gold dispensing paste of this invention can be prepared according to the following procedure. A 18% by weight solution of N-4 ethyl cellulose in diethylene glycol monobutyl ether acetate is prepared by gradually adding about 2.7 parts by weight of the ethyl cellulose to about 15.3 parts by weight of diethylene glycol monobutyl ether acetate. The diethylene glycol monobutyl ether acetate should be agitated while the ethyl cellulose is being added. Also, the temperature of the diethylene glycol monobutyl ether acetate should be maintained at about 45°–52° C., preferably about 45°–50° C. to aid in the dissolution of the ethyl cellulose. The resulting mixture should be agitated until the ethyl cellulose is completely dissolved, typically about 15 minutes. The resulting mixture is then inspected for inhomogenieties, such as lumps or small particles. If necessary, the mixture is further agitated until homogeneous.

The solution of ethyl cellulose in diethylene glycol monobutyl ether acetate is then cooled to about room temperature (about 20°–25° C.). To this solution is then added about 50.7 parts by weight of diethylene glycol monobutyl ether acetate. About 23.8 parts by weight of a polypropylene glycol having an average molecular weight of about 400 are added to the solution of ethyl cellulose in diethylene glycol monobutyl ether acetate.

The resulting mixture is then agitated and heated at about 58°–62° C. until homogeneous.

About 7.5 parts by weight Thixcin E are then gradually added while mildly agitating the mixture at a temperature of about 58°–62° C. After all of the Thixcin E has been added, the mixture is subjected to mild agitation to assure that all of the Thixcin E is in solution. Typically, this mixing period is about 5 minutes in duration.

The resulting mixture is then solidified by cooling to about room temperature. This mixture comprises the vehicle portion of the gold dispensing paste.

A solids component is then prepared by weighing two separate portions. One portion comprises about 96 parts by weight of a gold powder. The other portion comprises about 4 parts by weight of a particulate glass binder of about the following oxide percentages: 57% PbO, 21% ZnO and 22% $B_2O_3$.

About 36 parts by weight of the previously prepared vehicle are then heated in an agitated container until fluid, typically at about 58°–62° C. The particulate glass binder is then added with agitation to the fluid vehicle. The glass binder is mixed until all of the binder is wetted by the vehicle. The container is inspected to make sure the sides of the container are practically free of the glass binder.

In a similar manner, the gold powder is then added to the vehicle containing the glass binder. The addition of the gold powder is made gradually while the mixture is being agitated. The resulting mixture is again mixed to assure that all of the solids have been wetted by the vehicle. Typically, this mixing period is about 10 minutes duration. The mixture is then solidified by cooling to about room temperature. The order of addition of the gold and glass can, of course, be reversed.

The mixture is then milled by passing through a conventional milling machine, such as a three-roll mill. When a three-roll is used, the mixture is preferably passed through the mill several times. The three-roll mill is adjusted so that the front roll is provided with about a 0.002 inch gap for a first pass. The rear roll is provided with about a 0.0015 inch gap for the first pass. On second and third passes, the gap provided at the front roll is left unchanged, while the take-off roll is set at slightly less than about 0.001 inches, that is, the closest setting possible without coining the gold. A fourth pass is preferred with a take-off roll gap of about 0.002–0.003 inches, while the front roll is left unchanged. There results a paste having a smooth, homogenized appearance.

The paste is then preferably screened by passing it through a screen or filter to remove contaminants of large physical size. This is typically conducted by passing the paste through a screen of 400 U.S. Sieve Screen size.

The particle size of the paste is then determined by using a conventional fineness grind gauge. The average particle size of the paste is less than about 20 microns, and preferably about 10–16 microns. The fineness can be readily determined by placing a sample of the paste on a fineness grind gauge, and drawing the paste down to determine the average particle size and the number of scratches above 25, 20, and 15 microns. Preferably, no scratches should appear above 25 microns. It is particularly preferred that no scratches appear above 20 microns; however, as many as 10 scratches above 20 microns can be tolerated. In the event the paste does not meet the fineness criteria, it can be remilled and/or rescreened.

The viscosity of the gold dispensing paste of this invention at 25° C. is typically about $1.3 \times 10^6 - 10^6$ cps at 1 RPM with a ratio of 1/10 RPM of 6.5 to 9.0 when measured on a Brookfield Viscometer Model RVT. The viscosity can be adjusted, if necessary, by adding diethylene glycol monobutyl ether acetate, ethyl cellulose or the polypropylene glycol. The viscosity should not be measured for at least 4 or 5 hours after the paste has been prepared. Preferably, the viscosity is not measured until the day following the preparation of the paste.

Using the ingredients in the specified proportions in accordance with the previously described technique, there will result a gold dispensing paste having a viscosity which may be slightly higher than that desired. The viscosity can be lowered by adding in small amounts of solvent system consisting of about 2 parts by weight diethylene glycol monobutyl ether acetate and one part by weight of the polypropylene glycol. The solids content of the paste prepared according to the procedure just described should preferably not be less than about 63 weight percent.

The gold dispensing paste of this invention, then, comprises a vehicle having uniformly dispersed and suspended therein a solids component comprising gold, a glass binder, and optionally a portion of a noble metal other than gold. Small quantities of the gold dispensing paste of this invention are self-supporting at about room temperature. When prepared in accordance with the previously described technique, it is particularly advantageous because the paste is homogeneous and comprises a uniform distribution of the solids component. This permits ease of handling, and as will be apparent from the following discussion, permits workers in the art to attain desirable results in use.

The gold dispensing paste of this invention is then deposited in a cavity having a floor or bottom comprised of a ceramic substrate, preferably alumina. The deposited paste is exemplified in FIG. 2. The paste can be deposited by using conventional techniques, such as pulse screening or pulsing through a needle. When pulsed through a needle, it has been found that larger needle sizes are more desirable because of the relatively high viscosity of the paste.

The alumina substrate having the deposit of the gold dispensing paste of this invention is then placed in a furnace and heated to about 40°–60° C. During this initial heat treatment, the gold paste uniformly flows and fills the cavity. At the same time, the solids component comprising the noble metal or metals and glass binder drops to and stays on the bottom of the cavity because of a sudden decrease in the viscosity of the paste at about 40°–60° C. Thus, the substrate is subjected to this initial heat treatment for a time sufficient to permit the gold paste to flow and the solids component to settle out. The volatile organic components in the vehicle are then volatilized by heating to about 150°–300° C., preferably about 200°–225° C. This is typically for about 5–20 minutes. In fact, in commercial operation heating of the cavity from room temperature to up to about 300° C. is conducted in a single gradual heating step of about this time duration in a furnace.

The temperature of the substrate is then raised in a second heat treatment step to fire the solids component resulting in the formation of a strong bond to the substrate. These firing temperatures and times are conventional in the art. Persons skilled in the art will recognize that firing times, temperatures and atmospheric conditions in the furnace will vary depending upon the glass binder employed. Typically, the temperature during this firing step is about 725°–900° C., and the firing step is conducted for about 5–10 minutes. Persons skilled in the art will, of course, recognize that the glass binder must be fireable at a temperature below the coalescence point of the noble metals.

It will be apparent from the foregoing discussion that the subject invention involves a unique concept. First, a glass binder and noble metal are suspended in a paste which is self-supporting in small quantities at about room temperature. This is accomplished by employing as a vehicle a composition having a high viscosity and thixotropy. Thus, a thixotrope is employed to thicken a paste in a manner conventional in the art. For example, the use of thixotropes to maintain line resolution in fine-line microelectronic circuitry printing processes has been known in the art. However, in this invention a thixotrope is also used in an unconventional manner. That is, in practicing this invention it is desired that the viscosity of a paste containing a thixotrope actually be suddenly reduced at a temperature above room temperature. Thus, while a thixotrope is employed to build viscosity and thixotropy in one aspect of the invention, this viscosity and thixotropy are subsequently suddenly reduced in another aspect of the invention; that is, the thixotrope loses its ability to impart thixotropy at the elevated temperature. Reduction of the viscosity and thixotropy then leads to a further aspect of this invention, namely, the settling out of glass and noble metal particles to the bottom of a cavity due to the forces of gravity.

In prior art processes, the glass and noble metal were maintained in suspension by employing vibratory techniques. Thus, a paste was agitated by vibrating it at a rate sufficient to agitate the paste ingredients. In contrast, the composition and method of this invention eliminate the concern to keep the particulate matter in suspension since the paste of this invention inherently maintains the particulate matter in suspension. It is allowed to settle out upon the application of heat, which, of course, is controlled by the worker in the art.

This invention will be more clearly understood by reference to the following examples in which all parts, proportions, percentages and ratios are by weight unless otherwise indicated.

EXAMPLE 1

A gold dispensing paste having the following composition is prepared in accordance with the aforementioned technique:

| | |
|---|---:|
| Vehicle (36%): | |
| 18% solution of N-4 ethyl cellulose in butyl carbitol acetate | 18% |
| diethylene glycol monobutyl ether | 50.7% |

-continued

| | |
|---|---|
| polypropylene glycol (avg. mol. wt. = 400) | 23.8% |
| Thixcin E | 7.5% |
| Solids (64%): | |
| Gold Powder (A-1570 Englehard) | 96% |
| Glass Binder (PbO = 57%; ZnO = 21%; B₂O₃ = 22%) | 4% |

When this paste is deposited in the cavity of a microelectronic device and heated, there is obtained an excellent product. None of the gold travels up the sidewalls of the cavity or spills over the sidewalls of the cavity.

EXAMPLE 2

A gold dispensing paste having the following composition is prepared in accordance with the aforementioned technique:

| | |
|---|---|
| Vehicle (38%): | |
| N-4 ethyl cellulose | 5.1% |
| diethylene glycol monobutyl ether | 61.9% |
| polypropylene glycol (avg. mol. wt. = 400) | 26.5% |
| Thixcin E | 6.5% |
| Solids (62%): | |
| Gold Powder (A-1984 Englehard) | 96% |
| Glass Binder (PbO = 57%; ZnO = 21%; B₂O₃ = 22%) | 4% |

When this paste is deposited in the cavity of a microelectronic device and heated, there is obtained an excellent product. None of the gold travels up the sidewalls of the cavity or spills over the sidewalls of the cavity.

EXAMPLE 3

A gold dispensing paste having the following composition is prepared in accordance with the aforementioned technique:

| | |
|---|---|
| Vehicle (35%): | |
| N-4 ethyl cellulose | 3.4% |
| diethylene glycol monobutyl ether | 63.1% |
| polypropylene glycol (avg. mol. wt. = 400) | 26.5% |
| Thixcin E | 7.0% |
| Solids (65%): | |
| Gold Power (A-1570 Englehard) | 96% |
| Glass Binder (PbO = 57%; ZnO = 21%; B₂O₃ = 22%) | 4% |

When this paste is deposited in the cavity of a microelectronic device and heated, there is obtained an excellent product. None of the gold travels up the sidewalls of the cavity or spills over the sidewalls of the cavity.

The advantages of this invention will be readily apparent to persons skilled in the art. There is provided a screenable and dispensable paste, which when introduced into a cavity, will spread out on heating and fill the cavity, while solids in the paste settle to the bottom of the cavity. Thus, a gold film (or other noble metal film) will remain on the bottom of the cavity, and not travel up the sidewalls. Conventional printing pastes containing, for example, diethylene glycol monobutyl ether acetate, ethyl cellulose and the usual levels of thixotrope, etc., do not flow as easily as the paste of this invention. Furthermore, it sufficient gold is placed in a cavity of a microelectronic device to fill the cavity, the gold would be deposited on the sidewalls.

One of the central ingredients in the composition of this invention is the thixotrope, and more importantly what it accomplishes in the formulation. Thixotropes have been used in printing pastes to render the pastes more readily screenable. Such pastes are generally characterized by a screen viscosity index of about 60-1000 (rest viscosity/printing viscosity). The thixotropes also provide the paste with a sufficient recovery time after screen printing to maintain thin-line resolution. However, it is not believed that the use of a thixotrope in the manner employed in the subject invention was ever contemplated. Thus, the excesses of thixotropes used in this invention give the paste a screening or dispensing quality without which the paste would have a watery consistency. It is this latter state, this watery state, which is attained on heating the paste of this invention. The paste flows to fill the cavity and the solid particles drop to the bottom of the cavity.

Thus, while others have used printing pastes without a thixotrope, such pastes (also characterized as slurries) cannot be screened or dispensed readily and must be vibrated or shaken in some manner in order to keep the particles in suspension. Thus, by practicing the subject invention, elaborate vibratory and mixing systems need not be employed while the paste is being deposited in a cavity.

Furthermore, the paste of this invention can be handled more easily than prior art pastes used for deposition of full cavity gold since it is at a relatively high viscosity and thixotropy when it is deposited in the cavity. In contrast, some prior art pastes used for deposition of full cavity gold have been particularly difficult to handle because of their tendency to readily flow even at room temperature.

From an economic point of view, the pastes of this invention are particularly advantageous. It will be readily recognized that the solids component of a printing paste comprises a significant portion of the total cost of the paste. Thus, by providing means for depositing the solids component on the bottom of a cavity rather than the sidewalls, more efficient use is made of the solids component. Thus, for example, gold is not wasted on the sidewalls of the cavity or exterior surfaces.

Additionally, full cavity coverage without gold on the cavity sidewalls minimizes the possibility that failures will result from shorted leads or loose particles which would otherwise peel from the sidewalls. Thus, there is provided a composition and method which is simple, safe, reliable and readily reproducible.

Furthermore, the pastes of this invention can be applied in accordance with conventional techniques and conventional equipment. Once applied, the pastes can then be subjected to conventional preheat and firing steps.

What is claimed is;

1. In an improved gold dispensing paste composition comprising a vehicle, and a solids component including gold, the improvement wherein said paste composition comprises:
   A. about 75-25% by weight of said vehicle and said vehicle comprises in weight percent about ;
      1. 83-94% of an organic solvent consisting essentially of an admixture of diethylene glycol monobutyl ether acetate and polypropylene glycol having an average molecular weight of about 400 present together in said admixture, 2. 2–3% of an organic binding agent consisting essentially of N-4 to N-200 ethyl cellulose or mixtures thereof, and
3. 6–9% of an organic thixotrope consisting essentially of hydrogenated castor oil; and
B. about 25–75% by weight of said solid component uniformly dispersed in suspension in said vehicle and said solids component possesses a specific gravity greater than the specific gravity of said fluid vehicle at temperatures in the temperature range of 40°–60°C. comprises in weight percent about;
1. 2–6% of a particulate glass binder selected from the glass composition group consisting essentially of lead-zinc borate and lead borosilicate glass compositions, and
2. 98–94% of a gold powder; and wherein said paste composition possesses a fineness of less than 20 microns and a viscosity of about 1,300,000–1,700,000 cps at about 25° C.

2. Gold dispensing paste of claim 1 in which the paste comprises (A) about 30–42% by weight of the vehicle, and (B) about 70–58% by weight of the solids component.

3. Gold dispensing paste of claim 2 in which the organic solvent is about 88–92% by weight, the glass binder is about 3–5% by weight and the gold powder is about 97–95% by weight.

4. Gold dispensing paste of claim 1 in which fineness is about 10–16 microns.

5. Gold dispensing paste of claim 4 in which the glass binder comprises in about weight percent:
PbO: 57%
ZnO: 21%
$B_2O_3$: 22%.

6. Gold dispensing paste of claim 4 in which the glass binder comprises in about weight percent:
$SiO_2$: 17.6%
$B_2O_3$: 16.0%
$Al_2O_3$: 0.4%
PbO: 60.0%
CdO: 5.9%.

7. Gold dispensing paste of claim 6 in which the solids component includes up to about 6 percent palladium by weight.

8. A process of preparing an improved gold dispensing paste composition containing about 25–75% by weight of a fluid vehicle and 25–75% by weight of a solids component including gold, comprising the steps of:
A. selecting a fluid vehicle consisting essentially of 88–92% by weight of an organic solvent, 2–3% by weight of an organic binding agent and 6–9% by weight of an organic thixotrope, said fluid vehicle being prepared by the steps of:
1. preparing said organic solvent by admixing diethylene glycol monobutyl ether acetate together with polypropylene glycol having an average molecular weight of about 400,
2. selecting as said organic binding agent a material selected from the group consisting essentially of N-4 to N-200 ethyl cellulose binders or mixtures thereof, and admixing same with said organic solvent while heating and agitating said organic solvent to form a homogeneous first mixture,
3. selecting as said organic thixotrope a material consisting essentially of hydrogenated castor oil, and admixing same with said first mixture while heating and agitating said first mixture to form said fluid vehicle,
B. selecting for said solids component a material consisting essentially of 2–6% by weight of a particulate glass binder selected from the group consisting of a lead-zinc borate glass and a lead borosilicate glass or mixtures thereof, and of 94–98% by weight of a powdered noble metal material selected from the group consisting essentially of gold, gold alloys and mixtures thereof,
C. admixing said solids component with said fluid vehicle to wet said solids component particles and form a homogeneous dispersion thereof with said fluid vehicle,
D. cooling said homogeneous dispersion to form a paste, and
E. milling and screening said paste to a fineness of less than about 20 microns.

9. Process of preparing the gold dispensing paste of claim 8 in which the paste comprises (A) about 30–42% by weight of the vehicle, and (B) about 70–58% by weight of the solids component.

10. Process of preparing the gold dispensing paste of claim 9 in which the glass binder is about 3–5% by weight and the gold powder is about 97–95% by weight.

11. Process of claim 10 in which the binding agent is an N-4 ethyl cellulose and the thixotrope is a solidified hydrogenated castor oil having a particle size less than about 50 microns.

12. Process of claim 11 in which the fineness is about 10–16 microns.

13. Process of claim 12 in which the glass binder comprises in about weight percent:
PbO: 57%
ZnO: 21%
$B_2O_3$: 22%.

14. Process of claim 11 in which the fluid vehicle comprises about 15% by weight of the ethyl cellulose, and is prepared by adding, with agitation, the ethyl cellulose to diethylene glycol monobutyl ether acetate at a temperature of about 45°–50° C. and agitating until all the ethyl cellulose is dissolved in the diethylene glycol monobutyl ether acetate.

15. Process of claim 14 in which the heating of the first mixture is about 58°–62° C.

16. Process of claim 15 in which the heating of the first mixture and thixotrope is about 58°–62° C. to form the fluid vehicle.

17. Process of claim 16 in which the glass binder of the solids component and gold of the solids component are added separately to the vehicle while the vehicle is at a temperature of about 58°–62° C.

18. Process of claim 17 in which the first paste is milled by up to four passes through a three-roll mill.

19. Process of preparing the gold dispensing paste of claim 8, including selecting as said solids component only materials which possess a specific gravity greater than the specific gravity of said fluid vehicle at temperatures in the range of from about 40°–60° C.

20. A process of preparing an improved solid particle dispensing paste composition possessing a viscosity of about 1,300,000–1,700,000 cps at about 25° C. and containing about 25–75% by weight of a fluid vehicle and 25–75% of a solids component, comprising the steps of:
A. selecting a fluid vehicle consisting essentially of 83–94% by weight of an organic solvent, 2–6% by weight of an organic binding agent and 4–12% by weight of an organic thixotrope, said fluid vehicle being prepared by the steps of;
1. preparing said organic solvent by admixing diethylene glycol monobutyl ether acetate together with polypropylene glycol having an average molecular weight of about 400,
2. selecting as said organic binding agent a material selected from the group consisting essentially of N-4 to N-200 ethylcellulose binders or mixtures thereof, and admixing same with said organic solvent while heating and agitating said organic solvent to form a homogeneous first mixture,
3. selecting as said organic thixotrope a material consisting essentially of hydrogenated castor oil, and admixing same with said first mixture while heating and agitating said first mixture to form said fluid vehicle, B. selecting for said solids component a material consisting essentially of particulate material having a specific gravity greater than the specific gravity of said fluid vehicle at about 40°–60° C. and selected from the group consisting of lead-zinc borate glass and lead borosilicate glass and mixtures thereof, and optionally including a material selected from the group consisting of metals and alloys and mixtures thereof, C. admixing said solids component with said fluid vehicle to wet said solids component particles and form a homogeneous dispersion thereof with said fluid vehicle, D. cooling said homogeneous dispersion to form a paste, and E. milling and screening said paste to a fineness of less than about 20 microns.

21. Process of claim 20 in which the paste comprises (A) about 30–42% by weight of the vehicle, and (B) about 70–58% by weight of the solid particles.

22. A solid particle dispensing paste composition possessing a viscosity of about 1,300,000–1,700,000 cps at about 25° C. and including:
A. about 25–75% by weight of a vehicle comprising:
1. about 83–94% by weight of an organic solvent consisting essentially of an admixture of diethyelene glycol monobutyl ether acetate and polypropylene glycol having an average molecular weight of about 400 present together in said admixture,
2. about 2–3% by weight of an organic binding agent consisting essentially of N-4 to N-200 ethylcellulose or mixtures thereof, and
3. about 6–9% by weight of an organic thixotrope consisting essentially of hydrogenated castor oil; and B. about 25–75% by weight of solid particles possessing a specific gravity greater than the specific gravity of said vehicle at temperatures in the temperature range of 40°–60° C. and consisting essentially of:
1. powdered glass binder selected from the glass composition group consisting essentially of lead-zinc borate and lead borosilicate glass compositions, and
2. powdered noble metal.

23. Paste of claim 22 in which the paste comprises (A) about 30–42% by weight of the vehicle, and (B) about 70–58% by weight of the solid particles.

24. Paste of claim 23 having a fineness of less than about 20 microns.

* * * * *